(12) United States Patent
Vivares et al.

(10) Patent No.: US 6,348,142 B1
(45) Date of Patent: Feb. 19, 2002

(54) ELECTROPLATING MULTI-TRACE CIRCUIT BOARD SUBSTRATES USING SINGLE TIE BAR

(75) Inventors: Valerie Vivares, Palo Alto; Edwin R. Fontecha, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/633,620

(22) Filed: Aug. 7, 2000

(51) Int. Cl.[7] .................................................. C25D 5/02
(52) U.S. Cl. ........................ 205/125; 205/163; 205/165; 205/167
(58) Field of Search ................................ 205/125, 163, 205/165, 167

(56) References Cited

U.S. PATENT DOCUMENTS 5,976,341 A * 11/1999 Schumacher et al. ........ 205/125

* cited by examiner

Primary Examiner—Arun S. Phasge

(57) ABSTRACT

A method of electroplating circuit board substrate having a high density, multi-trace circuit pattern formed on at least one major surface of an insulative substrate, without requiring formation and at least partial removal of a large plurality of electrically conductive tie bars contacting each of the circuit traces for supplying electroplating potential/current, comprises providing the at least one major surface with a single tie bar having at least a pair of laterally extending arms in simultaneous electrical contact with an end of each trace. Portions of the tie bar extension arms are selectively removed after completion of electroplating, e.g., by laser drilling or plasma etching, to electrically separate each of the circuit traces from the tie bar. According to an embodiment of the invention, electroplating is simultaneously performed on a dual-sided substrate including electrically interconnected circuit patterns formed on opposite sides thereof. The invention enjoys particular utility in the fabrication of ball grid array (BGA) semiconductor device packages.

17 Claims, 3 Drawing Sheets

US 6,348,142 B1

ELECTROPLATING MULTI-TRACE CIRCUIT BOARD SUBSTRATES USING SINGLE TIE BAR

FIELD OF THE INVENTION

The present invention relates to electroplating a workpiece in the form a substantially flat, electrically insulative substrate having a multi-trace circuit pattern formed on at least one of a pair of opposed major surfaces. More particularly, the present invention relates to a method for simultaneously electroplating at least one metal or metal alloy layer on electrically interconnected, high density, multi-trace, circuit or contact patterns on both surfaces of a circuit board substrate utilized for mounting and providing electrical connections to a semiconductor integrated circuit (IC) die or chip, as in ball grid array (BGA) device packages, while minimizing the amount of surface area of the substrate which is occupied by tie bars and associated conductive elements utilized for supplying the substrate with an electrical potential during the electroplating.

BACKGROUND OF THE INVENTION

Electrical circuit boards and similar type components comprising complex, electrically interconnected circuit patterns formed on opposite sides of a planar, insulative substrate enjoy widespread utility in the manufacture of electrical and electronic components and devices. For example, an increasingly important aspect of semiconductor integrated circuit (IC) manufacturing technology is mounting of the semiconductor IC die or chip to an appropriate dual-sided substrate as part of a process for forming encapsulated device packages. Frequently, this requires providing the IC chip or die with as many input/output ("I/O") terminals as is feasible. As a consequence of the requirement for a large number of terminals to be formed on a limited amount of substrate surface, so-called "ball grid array" ("BGA") structures and bonding techniques have been developed in order to provide high areal density interconnections between the IC package and, e.g., a larger substrate.

A typical, encapsulated BGA type semiconductor IC device package (1) is shown in schematic, cross-sectional view in FIG. 1. According to such BGA type packaging, an IC die or chip (2) is mounted on a patterned, upper solder mask layer (3U) formed on the upper major surface (4U) of a dual-sided substrate (4), i.e., a dual-sided printed circuit board ("PCB") or a ceramic or composite material circuit board ("CCB") having an upper circuit pattern (5U) formed thereon. A plurality of electrical connections (6) comprising fine electrical wires, typically of gold (Au), are connected, as by wire bonding, between the upper surface (2U) of the IC die or chip (2) and a plurality of electrical bonding pad areas (7B) (also termed "bond fingers") of the upper circuit pattern (5U) exposed through a plurality of openings (3') selectively formed in solder mask layer (3U). Each of the electrically conductive traces or lines forming upper circuit pattern (5U) is electrically connected by means of an electrically conductive plug or via (7V) filling a through-hole (8) extending through the thickness of substrate (4), to at least one electrically conductive trace or line of a lower circuit pattern (5L) formed on the lower major surface (4L) of the substrate. A plurality of generally circularly-shaped "ball land" areas are exposed through openings (3") selectively formed in lower solder mask layer (3L) overlying substrate lower major surface (4L) for accommodating therein a spaced-apart plurality of substantially spherically-shaped electrical conductors (9) formed of a solder material and constituting a two-dimensional ball grid array (BGA). Finally, BGA package (1) includes a layer of molding material (10) encapsulating at least the IC die or chip (2).

According to BGA methodology, the device package with its substantially spherically-shaped BGA solder balls or bumps is then mated with a corresponding ball grid array (BGA) or bonding pad array formed on a substrate surface. Once mated, the solder balls or bumps of the IC device package and the corresponding solder balls or bumps or bonding pads of the substrate are heated to effect reflow and mutual bonding, whereby each solder ball or bump forms a bond between the IC device package and the substrate. As a consequence, each bonded combination functions as both an electrical and physical contact.

A variant of the above BGA bonding technology, known as "controlled collapse chip connection", or "C4", is particularly useful in applications having a very high density of electrical interconnections. According to C4 methodology, electrically conductive balls or bumps comprising a solder material are formed on the IC device package, as well as on the mating surface of the substrate. Bonding between the two sets of solder balls or bumps is effected by application of heat and mechanical pressure to the IC device package and the substrate. The application of heat causes both sets of solder-based balls or bumps to reflow, thereby providing physical and ohmic electrical connection therebetween, while the applied mechanical pressure causes the mated pairs of solder-based balls or bumps to at least partially collapse, creating a "pancake" shape which advantageously reduces interconnection length and resistance.

An essential feature of the above-described BGA fabrication methodology is the formation of suitable dual-sided substrates (4) having the requisite electrically interconnected circuit patterns (5U, 5L) formed on the opposing major surfaces (4U, 4L), wherein the circuit patterns are provided with one or more plated layers for minimizing corrosion due to environmental factors, etc., and for facilitating wetting and adhesion of solder-type contact materials thereto. However, the continuing increase in complexity of the IC chip or die (2) has necessitated a parallel increase in the number of I/O connections required to be made to the IC chip or die. The increase in IC complexity has necessitated a parallel increase in the number and complexity of the requisite electrically conductive traces constituting the upper and lower circuit patterns formed on the substrate, which increase in number and complexity has in turn resulted in a substantial decrease in the inter-trace spacings.

According to conventional methodologies for manufacturing dual-sided circuit boards suitable for use in BGA type packaging applications, multi-trace electrically conductive patterns, typically of copper (Cu) or a Cu-based alloy, are formed, as by conventional techniques, on both major surfaces of a substrate comprised of at least one electrically insulative material selected from polymers, ceramics, glasses, resins, laminates, and composites thereof, e.g., an epoxy resin-fiberglass composite, and electrically interconnected by means of a plurality electrically conductive via plugs filling through-holes extending between the opposing major surfaces.

FIG. 2 illustrates, in plan view, a corner portion of the upper major surface (4U) of a dual-sided substrate (4) of conventional type, wherein each of the individual traces ($5T_U$) of upper circuit pattern (5U) is shown as extending from an interior, device mounting portion or area of upper major surface (4U), where bond fingers (7B) are located, to the periphery thereof, where conductive via plugs (7V) are formed for electrical interconnection with the lower circuit pattern (4L), which pattern is not necessarily similarly configured. A plurality of tie bars (11) are formed on one of the major surfaces, e.g., on the upper major surface (4U), as shown, each tie bar (11) being electrically connected to an individual electrical trace ($5T_U$), for supplying the electrically interconnected upper and lower circuit patterns (5U, 5L) with an electrical potential, typically of negative polarity, for cathodically electroplating thereon a layer or layer system (i.e., a plurality of stacked layers) which, inter alia, provides corrosion resistance and facilitates low ohmic resistance bonding of solder-based electrical conductors thereto. Typically, thin layers of Ni and Au are sequentially electroplated over the Cu or Cu-based circuit patterns (5U, 5L) for this purpose. After completion of electroplating, the electrical connections between the various conductive traces ($5T_U$) and the respective tie bars (11) are severed, or the tie bars are completely removed, as by selective etching, etc.

While the use of electrically tie bars for facilitating simultaneous electroplating of circuit patterns on one or both surfaces of a substrate has been generally useful according to prior practices, as a consequence of the increased densification of the traces forming the circuit patterns as required by the progressive increase in IC complexity, the remaining, or free space (or "real estate") on the major surfaces (5U, 5L) of the substrate has progressively been reduced to where it currently is at a premium. Stated somewhat differently, trace densification of the circuit patterns has reached a state where the large plurality of individual tie bars (11) disadvantageously and deleteriously occupy scarce routing space on the substrate surface needed for the additional traces, vias, etc., necessitated by the increased amount of I/O connections to be made to the IC chip or die. Moreover, the presence of the tie bar(s) and associated extensions disadvantageously decreases the signal-to-noise ratio ("SNR") of the completed device package, and the need to sever the electrical connections between the tie bar and the conductive traces subsequent to electroplating adds additional steps and complexity to the overall substrate preparation process.

Accordingly, there exists a need for improved methodology for performing simultaneous electroplating of single and dual-sided, high trace density circuit board substrates in a simple, reliable, and rapid manner, which methodology eliminates the need for providing a large plurality of electrically conductive tie bars in electrical contact with respective individual conductive traces and other features constituting the conductive circuit patterns prior to electroplating, obviates any need for severing of the contacts subsequent to electroplating, and increases the SNR of the completed device package.

The present invention, wherein a single tie bar is formed in electrical contact with each of the electrically conductive features (e.g., circuit traces) comprising an electrical circuit pattern on one of a pair of opposed major surfaces of a substrate, and in which the electrical connections between the single tie bar and the plurality of electrical features are readily and rapidly severed after completion of electroplating, facilitates and simplifies electroplating of electrically conductive patterns on at least one of the major surfaces. The present invention, therefore, addresses and solves the need for improved methodology for simultaneous electroplating of at least one metal or metal alloy layer on electrically interconnected circuit patterns on both sides of a dual-sided substrate such as employed in fabricating the BGA-type device packages described supra, while eliminating the need for providing, and subsequently severing, electrically conductive tie bars for each of the large plurality of circuit features. The inventive methodology thus results in process simplification, frees scarce surface area of the substrate major surfaces for use in forming additional conductive traces thereon, and advantageously increases the SNR of the completed device package. Further, the methodology provided by the present invention enjoys diverse utility in the manufacture of numerous and various types of electrical and electronic devices and/or components utilizing dual-sided circuit board substrates.

DISCLOSURE OF THE INVENTION

An advantage of the present invention is an improved method for simple, rapid, reliable, electroplating of printed circuit board and other types substrates comprising multi-featured, electrically conductive circuit patterns.

Another advantage of the present invention is an improved method of simultaneously electroplating both major surfaces of dual-sided circuit board substrates utilized in fabricating ball grid array (BGA) semiconductor IC device packages.

Yet another advantage of the present invention is an improved dual-sided circuit board for use in fabricating BGA semiconductor device packages.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to one aspect of the present invention, the foregoing and other advantages are obtained in part by a method of electroplating a workpiece, which method comprises the sequential steps of:

(a) providing a workpiece comprising an electrically insulative substrate including first and second opposed major surfaces bounded by a periphery, a plurality of spaced-apart electrically conductive features forming a first circuit pattern on the first major surface, the first circuit pattern including a plurality of electrically conductive traces each extending toward a device mounting area of the first major surface and including a terminal end in the form of a bonding pad or finger adjacent the device mounting area, the first major surface further including thereon a single electrically conductive tie bar extending from the periphery of the substrate toward the device mounting area and including integrally formed lateral extensions in electrical contact with each of the bonding pads or fingers;

(b) contacting at least the first major surface of the substrate with at least one electroplating bath while applying an electrical potential to the tie bar, and electroplating at least one layer on at least the first circuit pattern on the first major surface; and (c) severing the electrical contact between the lateral extensions of the tie bar and each of the bonding pads or fingers.

According to embodiments of the present invention, step (c) comprises severing by means of laser drilling or plasma etching of selected areas, wherein the laser drilling of selected areas comprises utilizing a scanned laser beam or selective laser irradiation through a patterned mask overlying the first major surface; and the plasma etching of comprises etching selected areas exposed through a patterned mask overlying the first major surface.

According to particular embodiments of the present invention, step (a) comprises providing as the workpiece a dual-sided circuit board comprising a substrate having flat planar first and second opposed major surfaces, wherein the second major surface includes a second plurality of electrically conductive features forming a second circuit pattern, and each of the electrically conductive features of the first and the second circuit patterns are electrically interconnected by a plurality of electrically conductive vias extending through the thickness of the substrate; and step (c) comprises contacting both of the first and the second major surfaces of the substrate with at least one electroplating bath and simultaneously electroplating the at least one layer on both of the first and second circuit patterns.

According to various alternate embodiments of the present invention, step (a) comprises providing as the workpiece a substrate wherein the entire surface areas of each of the first and the second circuit patterns are exposed for electroplating thereon; or step (a) comprises providing as the workpiece a substrate wherein the entire surface area of one the circuit patterns is exposed for electroplating thereon and only selected portions of the other electrical circuit pattern are exposed for electroplating thereon through openings formed in an overlying layer of masking material; or step (a) comprises providing as the workpiece a substrate wherein only selected portions of the surface areas of each of the first and the second electrical circuit patterns are exposed for electroplating thereon through openings formed in a respective overlying layer of masking material.

According to embodiments of the present invention, step (a) comprises providing as the workpiece a substrate for a semiconductor device package having a ball grid array (BGA) contact arrangement, each of the layers of masking material comprises an electrically insulative solder mask material, the selected portions of the first circuit pattern exposed through the openings in the overlying layer of solder mask material form the bonding pads or fingers on the first major surface, and the selected portions of the second circuit pattern exposed through the overlying layer of solder masking material form a spaced-apart array of generally circularly-shaped ball land areas on the second major surface.

According to further embodiments of the present invention, step (a) comprises providing a dual-sided circuit board comprising at least one electrically insulative material selected from the group consisting of polymers, ceramics, glasses, resins, laminates, and composites thereof; and step (c) comprises electroplating at least one metal or metal alloy layer on the first and second pluralities of electrically conductive features.

According to particular embodiments of the present invention, step (a) comprises providing a dual-sided circuit board including first and second pluralities of copper (Cu) or Cu-based features; and step (c) comprises sequentially electroplating nickel (Ni) and gold (Au) layers thereon.

According to another aspect of the present invention, a method of manufacturing an electrical device comprises the sequential steps of:

(a) providing an electrically insulative substrate having substantially planar upper and lower major surfaces bounded by a periphery, each of the upper and the lower major surfaces including thereon a plurality of electrically conductive traces forming respective upper and lower circuit patterns, each of the traces of the upper circuit pattern extending toward a device mounting area of the upper major surface and including an end adjacent the device mounting area, the traces of the upper circuit pattern being electrically interconnected with the traces of the lower circuit pattern by means of electrically conductive vias extending through the substrate, and the first major surface further including thereon a single electrically conductive tie bar extending from the periphery of the substrate toward the device mounting area and including integrally formed lateral extensions in electrical contact with the end of each of the traces of the upper circuit pattern adjacent the device mounting area;

(b) applying a layer of an electrically insulative masking material over each of the upper and the lower circuit patterns;

(c) selectively removing portions of each layer of masking material to expose selected surface portions of the plurality of electrically conductive traces of the upper and the lower circuit patterns;

(d) contacting the upper and the lower surfaces of the substrate with at least one electroplating bath while applying a cathodic electrical potential to the tie bar and simultaneously electroplating at least one metal or metal alloy layer on the exposed surface portions of the upper and the lower circuit patterns; and (e) severing the electrical contact between the lateral extensions of the tie bar and each end of the traces of the upper circuit pattern.

According to embodiments of the present invention:

step (e) comprises severing by means of laser drilling or plasma etching; and step (a) comprises providing an electrically insulative substrate comprised of a material selected from the group consisting of polymers, ceramics, glass, resins, laminates, and composites thereof;

step (b) comprises applying a layer of a solder mask material on each of the upper and the lower major surfaces of the substrate and covering the respective upper and lower circuit patterns; and step (c) comprises selectively removing portions of the solder mask layer from the upper circuit pattern to expose the plurality of electrically conductive bonding pads or fingers and selectively removing portions of the solder mask layer from the lower circuit pattern to expose a plurality of generally circularly-shaped ball land areas in a spaced-apart array for accommodating an array of spaced-apart, substantially spherically-shaped electrical conductors for a ball grid array (BGA).

According to embodiments of the present invention, step (a) comprises providing a substrate wherein each of the upper and lower circuit patterns includes a plurality of copper (Cu) or Cu-based traces; step (d) comprises sequentially electroplating a nickel (Ni) layer and a gold (Au) layer on each of the exposed areas of each of the upper and the lower circuit patterns; and the method comprises the further steps of:

(f) affixing a substantially spherically-shaped electrical conductor to each of the plurality of exposed areas of the lower circuit pattern to form a ball grid array (BGA);

(g) mounting a semiconductor integrated circuit (IC) die or chip on the layer of solder mask material on the upper major surface of the substrate;

(h) forming at least one electrical connection between the IC die or chip and at least one of the bonding pad areas of the upper circuit pattern; and (i) encapsulating at least the IC die or chip in a molding material.

According to still another aspect of the present invention, a dual-sided circuit board comprises:

an electrically insulative substrate having substantially planar upper and lower major surfaces bounded by a periphery, each of the upper and the lower major surfaces including thereon a plurality of electrically conductive traces forming respective upper and lower circuit patterns, each of the traces of the upper circuit pattern extending toward a device mounting area of the upper major surface and including an end adjacent to the device mounting area, the traces of the upper circuit being electrically interconnected with the traces of the lower electrical circuit pattern by means of a plurality of electrically conductive vias extending through the thickness of the substrate, and the first major surface further including thereon a single electrically conductive tie bar extending from the periphery of the substrate toward the device mounting area and including integrally formed lateral extensions in electrical contact with the end of each of the traces of the upper circuit pattern adjacent the device mounting area; and a layer of an electrically insulative masking material formed over each of the upper and the lower circuit patterns, each of the layers of masking material including a plurality of openings extending therethrough and exposing selected surface portions of the upper and lower circuit patterns, the exposed surface portions of the upper circuit pattern defining a plurality of electrically conductive bonding pads or fingers at the ends of the traces and the exposed surface portions of the lower circuit pattern defining a plurality of generally circularly-shaped, electrically conductive ball land areas in a spaced-apart array for accommodating an array of spaced-apart, substantially spherically-shaped electrical conductors for a ball grid array (BGA).

According to embodiments of the present invention, the electrically insulative substrate comprises a material selected from the group consisting of polymers, ceramics, glass, resins, laminates, and composites thereof; the masking material comprises a solder mask material; and each of the upper and the lower circuit patterns comprises a plurality of copper (Cu) or Cu-based traces with sequentially electroplated nickel (Ni) and gold (Au) layers thereon.

Additional advantages and aspects of the present invention will become apparent to those skilled in the art from the following detailed description, wherein embodiments of the invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon the discovery that electroplating of a workpiece having a high trace density., electrical circuit pattern formed on at least one major surface of an electrically insulative substrate, e.g., printed circuit boards, can be readily performed without requiring a large plurality of electrically conductive tie bars for providing electrical contact to a corresponding large plurality of electrically conductive traces forming the circuit pattern. A key feature of the present invention is the provision of a single electrically conductive tie bar having at least a pair of lateral extensions ("arms") for effecting simultaneous electrical contact with an end of each of the conductive traces on a major surface of the substrate, adjacent to a centrally located device mounting area or portion. The inventive principle comprising providing a single tie bar with lateral extensions for electrically contacting each of the circuit features is also applicable to use with dual-sided substrates comprising electrically interconnected circuit patterns, for effecting simultaneous electroplating of at least one metal or metal alloy layer on both substrate surfaces. As a consequence of the inventive methodology, the need for processing steps for formation and severing (or even removal) of a large plurality of electrically conductive tie bars each connected to individual circuit pattern features, is eliminated, leading to process simplification and increase in the surface area of the substrate available for additional circuit pattern formation necessitated by increase in semiconductor device complexity and degree of integration. In addition, the SNR of the completed device package is advantageously increased vis-á-vis device packages obtained according to the conventional methodology.

Figure 1:
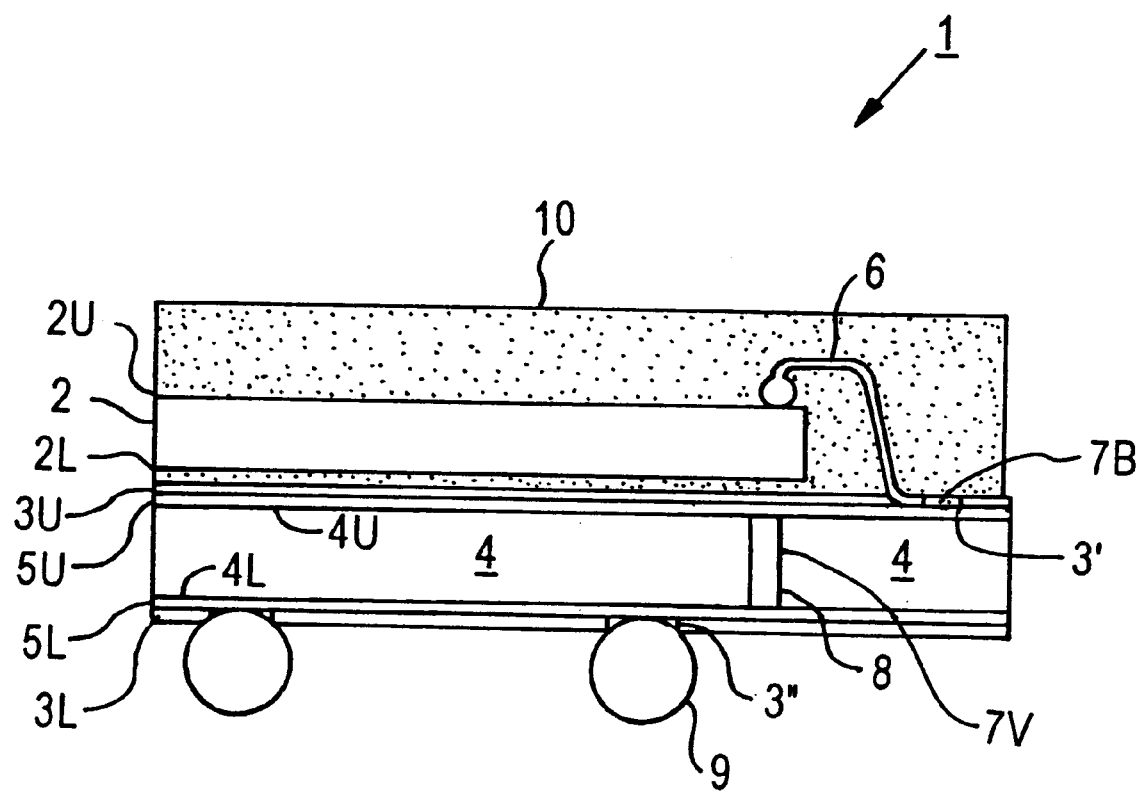
FIG. 1 is a schematic, cross-sectional view of a BGA type semiconductor IC device package comprising a dual-sided substrate prepared according to the present invention.
Figure 2:
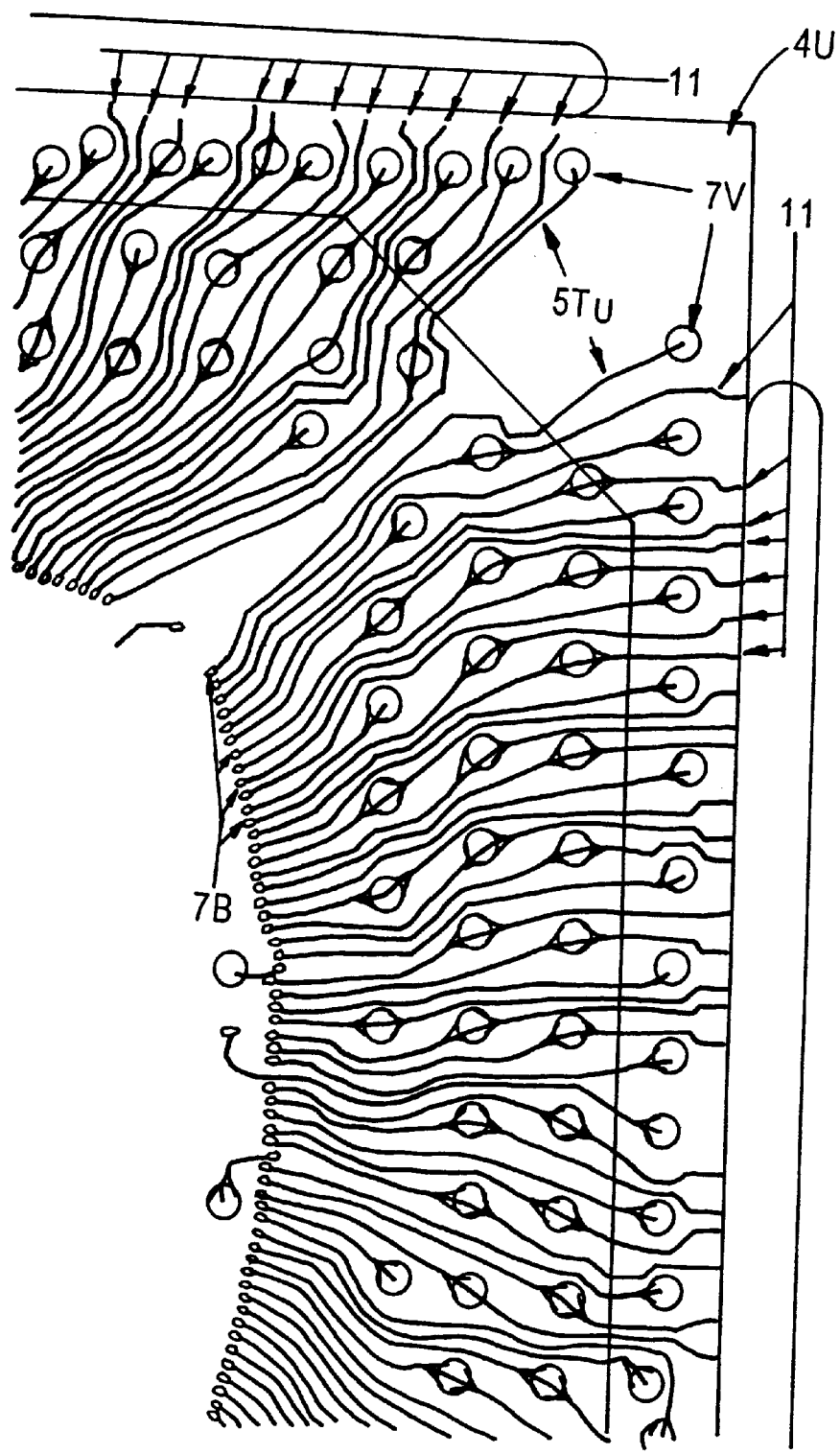
FIG. 2 is a schematic plan view illustrating a corner portion of the upper surface of a dual-sided substrate according to the conventional art, including a plurality of electrically conductive tie bars.
Figure 3:
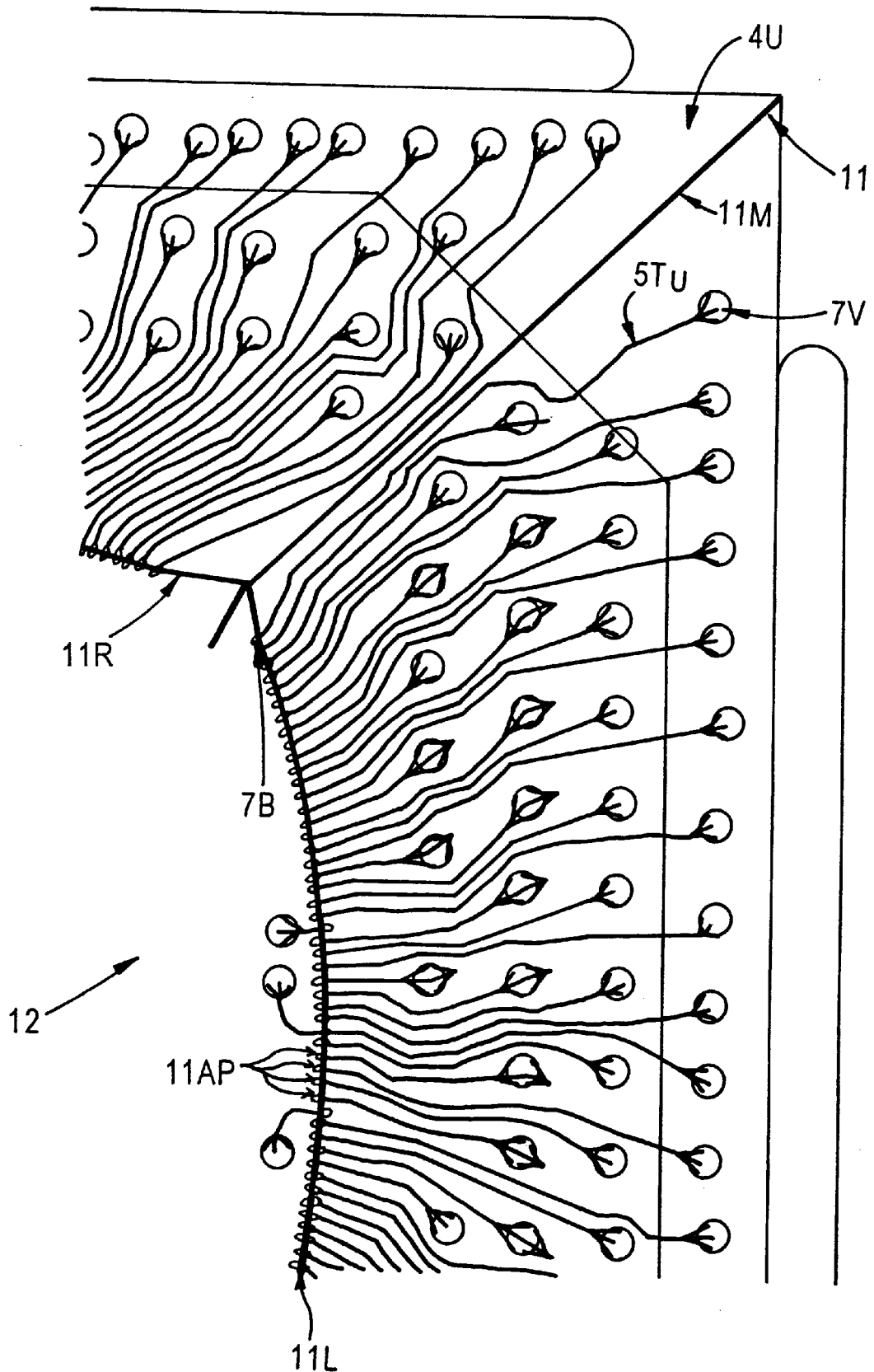
FIG. 3 is a schematic plan view illustrating a corner portion of the upper surface of a dual-sided substrate according to the present invention, including a single electrically conductive tie bar.

According to a first step of the present invention, a workpiece comprising a suitable dual-sided substrate is provided, e.g., of conventional type such as employed in the fabrication of electrical and electronic components and devices, for example, in the BGA type semiconductor IC device package shown in FIG. 1 and described supra. By way of illustration only, and with reference to FIG. 3, a suitable workpiece for use according to the present invention comprises a flat planar substrate (4) having a pair (i.e., upper and lower) of opposed major surfaces (4U, 4L), of which only the upper major surface (4U) is shown in FIG. 3. The substrate (4) is comprised of at least one electrically insulative material selected from polymers, ceramics, glasses, resins, laminates, and composites thereof, e.g., an epoxy resin-fiberglass composite. A high density circuit pattern is present on at least one of the major surfaces of the substrate (4), illustratively the upper surface (4U), and is comprised of a large plurality of electrically conductive traces ($5T_U$) of e.g., copper (Cu) or a Cu-based alloy, configured for use in a particular application, and is formed by conventional techniques, including, inter alia, electroplating, photolithographic masking and etching, laser drilling, metal filling, etc. According to the illustrated embodiment, wherein a dual-sided substrate for use in a BGA type device package is to be formed, high density multi-trace electrical circuit patterns (not necessarily of the same configuration) are formed on each of the upper (4U) and lower (4L) major surfaces of the substrate (4) and electrically interconnected by means of conductive via plugs (7V) filling a plurality of through-holes (8, see FIG. 1) extending through the thickness of the substrate.

A key feature of the present invention is the provision of a single electrically conductive tie bar (11) having a main segment (11M) extending diagonally from a corner of the upper surface (4U) of the substrate (4) toward the interior, or central, device mounting area or portion (12) adjacent the interiorly facing ends of the plurality of circuit traces ($5T_U$), i.e., where the respective bonding pads or fingers (7B) are located. At least a pair of laterally extending segments in the form of angularly opposed arms (11L, 11R) are integrally formed with the tie bar (11) at the interior end thereof and extend transversely to and in electrical contact with each of the circuit traces ($5T_U$). The thicknesses and widths of each of the main (11M) and extending (11L, 11R) segments of the tie bar (11) are selected for use in a particular application, based upon the magnitude of the total electroplating current required for depositing particular metal or metal alloy layer (s).

According to a second step of the embodiment, a layer of a suitable masking material (3U, 3L) is applied to each of the major surfaces of the substrate so as to cover the respective circuit patterns (5U, 5L) thereon. Illustratively, the layers may comprise a solder mask material, e.g., for facilitating subsequent electrical contacts to the circuit patterns by solder-type bonding processes.

In the third step of the embodiment, selected portions of each of the masking material layers (3U, 3L) are removed, as by conventional photolithographic masking and etching techniques, to expose selected areas of the electrically conductive traces which form the respective circuit patterns, e.g., bonding pad areas or "fingers" (3') of the circuit pattern on the upper surface of the substrate and "ball land areas" (3") of the circuit pattern on the lower surface of the substrate.

According to the next step of the illustrated embodiment of the invention, the workpiece (i.e., substrate) is immersed in at least one metal or metal alloy plating bath, along with a suitable counter-electrode (i.e., an anode), for electroplating of at least one metal or metal alloy layer on the exposed electrically conductive areas of both major surfaces of the substrate, by applying a cathodic electrical potential simultaneously to the upper and lower circuit patterns via the single tie bar arrangement. According to the illustrated embodiment, electroplating current flows from the power supply to the lower circuit pattern to effect electroplating of the exposed surface areas thereof, via the main tie bar segment (11M) and its lateral extensions or arms (11L, 11R) in electrical contact with each of the circuit traces ($5T_U$) on the upper surface (4U) of the substrate (4), the latter being in electrical contact with the electrically conductive vias (7V), which in turn contact the various traces ($5T_L$) of the lower circuit pattern (5L). By way of illustration only, nickel (Ni) and gold (Au) layers may be sequentially plated from suitable Ni and Au plating baths onto Cu or Cu-based traces ($5T_U$, $5T_L$) for, inter alia, increasing corrosion resistance and facilitating solder bonding thereto in later processing.

In the following step according to the present invention, each of the portions or segments (11AP) of the laterally extending arms (11L, 11R) of the tie bar (11) located between each pair of adjacent circuit traces ($5T_U$) is removed, thereby severing the electrical connections between the traces and the tie bar and between the traces.

According to the inventive methodology, removal of the portions or segments of the laterally extending arms of the tie bar located between adjacent pairs of circuit traces is preferably accomplished by means of conventional laser drilling or plasma etching techniques. For example, laser drilling of selected areas of the tie bar arms may be performed utilizing a scanned laser beam of appropriate power or intensity, or by irradiation of laser energy through a patterned mask overlying the electroplated surface(s) of the substrate. Plasma etching of selected areas of the tie bar arms may be similarly performed with the aid of a patterned, etch-resistant mask.

After electroplating of Ni and Au layers on the exposed areas of the traces constituting the circuit patterns on the upper and lower major surfaces of the substrate, and severing of the electrical connections with the tie bar (11), as described above, the plated substrate (4) is subjected to further processing steps of conventional nature, e.g., as described supra with respect to FIG. 1, to form a desired device or component, e.g., a BGA type semiconductor IC device package as illustrated in FIG. 1.

The inventive principle of utilizing a single tie bar for electroplating dual-sided substrates having electrically interconnected circuit patterns, followed by convenient and rapid severing of electrical connections between the tie bar and the circuit pattern features, thereby eliminating the need for individual tie bars and preserving scarce substrate surface area for use in forming additional circuit features necessitated by increased device complexity and/or integration, is not limited to use with the illustrated embodiment involving formation of semiconductor IC die or chip-based devices, components, or packages. Rather, the inventive methodology can be utilized with all manner of dual-sided printed circuit boards ("PCB"s). Moreover, the invention can be effectively employed in instances where the patterned, insulative masking layer of the illustrated embodiment is not required to be formed over either of the circuit patterns, or need be formed over only one of the circuit patterns.

A number of advantages over conventional technology for electroplating single and/or dual-sided substrates comprising high feature density circuit patterns are thus provided by the inventive methodology, including, inter alia, elimination of the requirement for the provision (and at least partial removal) of a large plurality of individual tie bars, preservation of the surface areas otherwise occupied by the tie bars for use in forming additional conductive traces, etc., of the circuit patterns, and an increase in the SNR of the completed device package.

In the previous description, numerous specific details have been set forth, such as specific materials, structures, processes, etc., in order to provide a better understanding of the present invention. However, the present invention can be practiced without resorting to the details specifically set forth. In other instances, well-known processing techniques and structures have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes and/or modifications within the scope of the inventive concept as expressed herein.

What is claimed is:

1. A method of electroplating a workpiece, which method comprises the sequential steps of:

(a) providing a workpiece comprising an electrically insulative substrate including first and second opposed major surfaces bounded by a periphery, a plurality of spaced-apart, electrically conductive features forming a first circuit pattern on said first major surface, said first circuit pattern including a plurality of electrically conductive traces each extending toward a device mounting area of said first major surface and including a terminal end in the form of a bonding pad or finger adjacent said device mounting area, said first major surface further including thereon a single electrically conductive tie bar extending from said periphery of said substrate toward said device mounting area and including integrally formed lateral extensions in electrical contact with each of said bonding pads or fingers;

(b) contacting at least said first major surface of said substrate with at least one electroplating bath while applying an electrical potential to said tie bar, and electroplating at least one layer on at least said first circuit pattern on said first major surface; and (c) severing the electrical contacts between said lateral extensions of said tie bar and each of said bonding pads or fingers.

2. The method as in claim 1, wherein:

step (c) comprises severing by means of laser drilling or plasma etching.

3. The method as in claim 2, wherein:

step (c) comprises laser drilling of selected areas utilizing a scanned laser beam or selective laser irradiation through a patterned mask overlying said first major surface.

4. The method as in claim 2, wherein:

step (c) comprises plasma etching selected areas through a patterned mask overlying said first major surface.

5. The method as in claim 1, wherein:

step (a) comprises providing as said workpiece a dual-sided circuit board comprising a substrate having planar first and second opposed major surfaces, wherein said second major surface includes a second plurality of electrically conductive features forming a second circuit pattern, and each of said electrically conductive features of said first and said second circuit patterns are electrically interconnected by a plurality of electrically conductive vias extending through the thickness of said substrate; and step (c) comprises contacting both of said first and said second major surfaces of said substrate with said at least one electroplating bath and simultaneously electroplating said at least one layer on both of said first and second circuit patterns.

6. The method as in claim 5, wherein:

step (a) comprises providing as said workpiece a substrate wherein the entire surface areas of each of said first and said second circuit patterns are exposed for electroplating thereon.

7. The method as in claim 5, wherein:

step (a) comprises providing as said workpiece a substrate wherein the entire surface area of one of said first and second circuit patterns is exposed for electroplating thereon and only selected portions of the surface area of the other circuit pattern are exposed for electroplating thereon through openings formed in an overlying layer of masking material.

8. The method as in claim 5, wherein:

step (a) comprises providing as said workpiece a substrate wherein only selected portions of the surface areas of each of said first and said second patterns are exposed for electroplating thereon through openings formed in respective overlying layers of masking material.

9. The method as in claim 8, wherein:

step (a) comprises providing as said workpiece a substrate for a semiconductor device package having a ball grid array (BGA) contact arrangement, each of said layers of masking material comprises an electrically insulative solder mask material, said selected portions of said first circuit pattern exposed through said openings in said overlying layer of solder mask material form said bonding pads or fingers on said first major surface, and said selected portions of said second circuit pattern exposed through said overlying layer of solder masking material form a spaced-apart array of generally circularly-shaped ball land areas on said second major surface.

10. The method as in claim 5, wherein:

step (a) comprises providing a dual-sided circuit board comprising at least one electrically insulative material selected from the group consisting of polymers, ceramics, glasses, resins, laminates, and composites thereof.

11. The method as in claim 5, wherein:

step (c) comprises electroplating at least one metal or metal alloy layer on said first and second pluralities of electrically conductive features.

12. The method as in claim 5, wherein:

step (a) comprises providing a dual-sided circuit board including first and second pluralities of copper (Cu) or Cu-based features; and step (c) comprises sequentially electroplating nickel (Ni) and gold (Au) layers thereon.

13. A method of manufacturing a semiconductor device, comprising the sequential steps of:

(a) providing an electrically insulative substrate having substantially planar upper and lower major surfaces bounded by a periphery, each of said upper and said lower major surfaces including thereon a plurality of electrically conductive traces forming respective upper and lower circuit patterns, each of said traces of said upper circuit pattern extending toward a device mounting area of said upper major surface and including an end adjacent said device mounting area, said traces of said upper circuit pattern being electrically interconnected with said traces of said lower circuit pattern by means of a plurality of electrically conductive vias extending through said substrate, and said first major surface further including thereon a single electrically conductive tie bar extending from said periphery of said substrate toward said device mounting area and including integrally formed lateral extensions in electrical contact with the end of each of said traces of said upper circuit pattern adjacent said device mounting area;

(b) applying a layer of an electrically insulative masking material over each of said upper and said lower circuit patterns;

(c) selectively removing portions of each layer of masking material to expose selected surface portions of the electrically conductive traces of the upper and lower circuit patterns;

(d) contacting said upper and said lower surfaces of said substrate with at least one electroplating bath while applying a cathodic electrical potential to said tie bar and simultaneously electroplating at least one metal or metal alloy layer on the exposed surface portions of said upper and said lower circuit patterns; and (e) severing said electrical contact between said lateral extensions of said tie bar and each said end of said traces of said upper circuit pattern.

14. The method as in claim 13, wherein:

step (e) comprises severing by means of laser drilling or plasma etching.

15. The method as in claim 13, wherein:

step (a) comprises providing an electrically insulative substrate comprised of a material selected from the group consisting of polymers, ceramics, glass, resins, laminates, and composites thereof;

step (b) comprises applying a layer of a solder mask material on each of said upper and said lower major surfaces of said substrate and covering the respective upper and lower circuit patterns; and step (c) comprises selectively removing portions of said solder mask layer from said upper circuit pattern to expose said plurality of electrically conductive bonding pads or fingers and selectively removing portions of said solder mask layer from said lower circuit pattern to expose a plurality of generally circularly-shaped ball land areas in a spaced-apart array for accommodating an array of spaced-apart, substantially spherically-shaped electrical conductors for a ball grid array (BGA).

16. The method as in claim 15, wherein:

step (a) comprises providing an insulative substrate wherein each of said upper and lower circuit patterns includes a plurality of copper (Cu) or Cu-based traces; and step (d) comprises sequentially electroplating a nickel (Ni) layer and a gold (Au) layer on each of said exposed areas of each of said upper and said lower circuit patterns.

17. The method as in claim 16, further comprising the steps of:

(f) affixing a substantially spherically-shaped electrical conductor to each of said plurality of exposed ball land areas of said lower circuit pattern to form a ball grid array (BGA);

(g) mounting a semiconductor integrated circuit (IC) die or chip on said layer of solder mask material on said upper major surface of said substrate;

(h) forming electrical connections between said IC die or chip and said bonding pads or fingers of said upper circuit pattern; and (i) encapsulating at least said IC die or chip in a molding material.

* * * * *